United States Patent
Lee et al.

(10) Patent No.: US 8,525,160 B2
(45) Date of Patent: Sep. 3, 2013

(54) ORGANIC LIGHT EMITTING DEVICE

(75) Inventors: Chang-Ho Lee, Yongin (KR); Se-Jin Cho, Yongin (KR); Il-Soo Oh, Yongin (KR); Hee-Joo Ko, Yongin (KR); Hyung-Jun Song, Yongin (KR); Jin-Young Yun, Yongin (KR); Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 219 days.

(21) Appl. No.: 13/137,162

(22) Filed: Jul. 25, 2011

(65) Prior Publication Data

US 2012/0018707 A1    Jan. 26, 2012

(30) Foreign Application Priority Data

Jul. 26, 2010    (KR) .................. 10-2010-0071977

(51) Int. Cl.
*H01L 35/24* (2006.01)
(52) U.S. Cl.
USPC .................................... 257/40; 257/E51.001

(58) Field of Classification Search
USPC ............................................. 257/40, E51.001
See application file for complete search history.

(56) References Cited

FOREIGN PATENT DOCUMENTS

| JP | 2007-258745 | 10/2007 |
|---|---|---|
| KR | 10-2005-0054945 A | 6/2005 |
| KR | 10-2007-0013002 A | 1/2007 |
| KR | 10-2007-0014893 A | 2/2007 |

*Primary Examiner* — Anthony Ho
(74) *Attorney, Agent, or Firm* — Lee & Morse, P.C.

(57) ABSTRACT

An organic light-emitting device including a substrate; a first electrode; a second electrode; an emission layer; a first electron transport layer; a second electron transport layer; a third electron transport layer; and a hole transport layer, wherein the first electron transporting material has an electron mobility smaller than an electron mobility of the second electron transporting material at an electric field of 800 to 1000 V/cm, the second electron transporting material and the third electron transporting material each independently have an electron mobility of about $10^{-8}$ to about 10 $cm^2/V \cdot s$ at an electric field of 800 to 1000 V/cm, and the third electron transport layer has an electron injection barrier of about 0.2 eV or less at an interface between the third electron transport layer and the second electrode.

23 Claims, 3 Drawing Sheets

ORGANIC LIGHT EMITTING DEVICE

BACKGROUND

1. Field

Embodiments relate to an organic light-emitting device.

2. Description of the Related Art

Organic light-emitting devices are self-emission type display devices which may include two electrodes and a fluorescent or phosphorescent organic layer interposed between the electrodes. When a current is provided to the fluorescent or phosphorescent organic layer, electrons and holes may be recombined in the fluorescent or phosphorescent organic layer, thereby generating light.

Organic light-emitting devices may be manufactured as lightweight, thin information display devices that display high-quality images and may have a short response time and wide viewing angles. Due to these advantages, research into organic light-emitting devices has been actively performed and various organic light-emitting devices have been rapidly developed. Currently, their application ranges are widened to include mobile phones and other high-quality information display devices.

In regard to organic light-emitting devices, an organic emission layer (EML) may be disposed between an anode and a cathode. In addition, a hole related layer, e.g., a hole injection layer (HIL) and/or a hole transport layer (HTL), and an electron related layer, e.g., an electron transport layer (ETL) and/or an electron injection layer (EIL), may be further disposed between the anode and the cathode.

SUMMARY

Embodiments are directed to an organic light-emitting device.

At least one of the above and other features and advantages may be realized by providing an organic light-emitting device including a substrate; a first electrode; a second electrode facing the first electrode; an emission layer between the first electrode and the second electrode; a first electron transport layer between the second electrode and the emission layer, the first electron transport layer including a first electron transporting material; a second electron transport layer between the second electrode and the first electron transport layer, the second electron transport layer including a second electron transporting material; a third electron transport layer between the second electrode and the second electron transport layer, the third electron transport layer including a third electron transporting material and a fourth electron transporting material; and a hole transport layer between the first electrode and the emission layer, wherein the first electron transporting material has an electron mobility smaller than an electron mobility of the second electron transporting material at an electric field of 800 to 1000 V/cm, the second electron transporting material and the third electron transporting material each independently have an electron mobility of about $10^{-8}$ to about $10^{-3}$ cm$^2$/V·s at an electric field of 800 to 1000 V/cm, and the third electron transport layer has an electron injection barrier of about 0.2 eV or less at an interface between the third electron transport layer and the second electrode.

The first electron transporting material may include a metal complex including at least one of an oxadiazole derivative, a triazine derivative, a triazole derivative, and an 8-hydroxyquinoline derivative.

The first electron transporting material may include at least one of 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7), 4,4'-bis-[2-(4,6-diphenyl-1,3,5-triazinyl)]-1,1'-biphenyl (T1), 3-(4-biphenyl)-4-phenyl-5-(4-tert-butylphenyl)-1,2,4-triazole (TAZ), tris(8-hydroxyquinoline)aluminum (Alq$_3$), and bis(8-hydroxy-2-methylquinoline)-(4-phenylphenoxy)aluminum (Balq).

The second electron transporting material may include a metal complex including at least one of a phenanthroline derivative, an anthracene derivative, a pyrimidine derivative, a pyridine derivative, and a benzoquinoline derivative.

The second electron transporting material may include at least one of 2,9-dimethyl-4,7-diphenylphenanthroline (DPh-Phen), (poly[(9,9-di-hexylfluorene-2,7-diyl)-co-(pyridine-3,5-diyl)]) (PF-Py), and bis(10-hydroxybenzo[h]quinolinato)beryllium (Bebq$_2$).

The third electron transporting material may include at least one of phenanthroline derivative, an anthracene derivative, a pyrimidine derivative, a pyridine derivative, and a benzoquinoline derivative.

The third electron transporting material may include at least one of 2,9-dimethyl-4,7-diphenylphenanthroline (DPh-Phen), poly[(9,9-di-hexylfluorene-2,7-diyl)-co-(pyridine-3,5-diyl)] (PF-Py), and bis(10-hydroxybenzo[h]quinolinato)beryllium (Bebq$_2$).

The fourth electron transporting material may include at least one of LiF, LiQ, NaQ, CsF, BaF, BaO, Al$_2$O$_3$, Ca, Cs, Yb, and C$_{60}$.

A difference between an electron mobility of the first electron transporting material and an electron mobility of the second electron transporting material may be about $10^{-5}$ to about $10^{-4}$ cm$^2$/V·s at an electric field of 800 to 1000 V/cm.

The second electron transporting material may be identical to the third electron transporting material.

A weight ratio of the third electron transporting material to the fourth electron transporting material in the third electron transport layer may be about 5:95 to about 95:5.

In an electron-only-device including the first electron transport layer and the second electron transport layer, a driving voltage of the first electron transport layer may be smaller than a driving voltage of the second electron transport layer.

A thickness of the first electron transport layer may be about 5 to about 30 nm.

A thickness of the second electron transport layer may be about 3 to about 20 nm.

A thickness of the third electron transport layer may be about 3 to about 20 nm.

A sum of thicknesses of the first electron transport layer, the second electron transport layer, and the third electron transport layer may be about 11 to about 70 nm.

The hole transport layer may include at least one of N-phenylcarbazole, polyvinylcarbazole, 1,3,5-tris(carbazolyl)benzene, 4,4'-bis(carbazolyl)biphenyl, m-bis(carbazolyl)phenyl, 4,4'-bis(carbazolyl)-2,2'-dimethylbiphenyl, 4,4',4"-tris(N-carbazolyl)triphenylamine, 1,3,5-tris(2-carbazolylphenyl)benzene, 1,3,5-tris(2-carbazolyl-5-methoxyphenyl)benzene, bis(4-carbazolylphenyl)silane, N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'-diamine (TPD), poly(9,9-dioctylfluorene-co-N-(4-butylphenyl) diphenylamine (TFB), and poly(9,9-dioctylfluorene-co-bis-(4-butylphenyl-bis-N,N-phenyl-1,4-phenylenediamin (PFB).

The organic light-emitting device may further include an electron injection layer between the second electrode and the third electron transport layer.

The electron injection layer may include at least one of LiF, LiQ, NaCl, NaQ, BaF, CsF, Li$_2$O, Al$_2$O$_3$, BaO, and C$_{60}$.

The organic light-emitting device may further include a hole injection layer between the first electrode and the hole transport layer.

The second electrode may include at least one of lithium (Li), magnesium (Mg), aluminum (Al), calcium (Ca), silver (Ag), ytterbium (Yb), aluminum-lithium (Al—Li), magnesium-indium (Mg—In), magnesium-silver (Mg—Ag), and silver-ytterbium (Ag—Yb).

The organic light-emitting device may further include a hole blocking layer between the emission layer and the first electron transporting layer.

The organic light-emitting layer may have a structure of a sequentially stacked: substrate/first electrode/hole injection layer/hole transport layer/emission layer/Alq$_3$-containing first electron transport layer/Bebq$_2$-containing second electron transport layer/Bebq$_2$ and LiF-containing third electron transport layer/electron injection layer/second electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
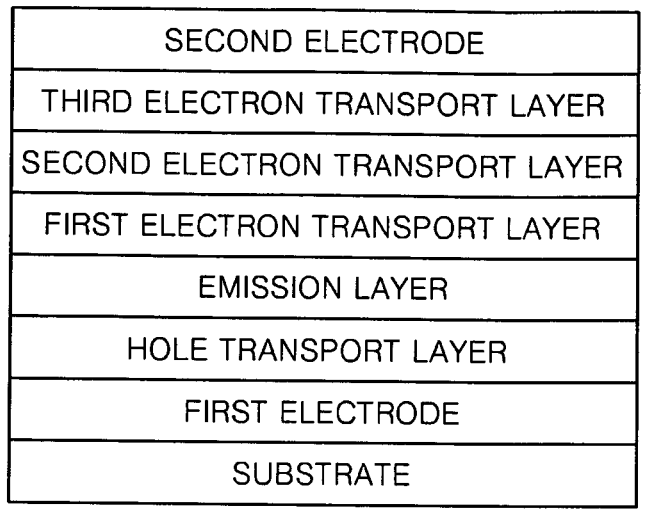
FIGS. 1A through 1D illustrate schematic sectional views of organic light-emitting devices according to the embodiments.

Korean Patent Application No. 10-2010-0071977, filed on Jul. 26, 2010, in the Korean Intellectual Property Office, and entitled: "Organic Light Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

An organic light-emitting device according to an embodiment may include, e.g., a substrate; a first electrode; a second electrode facing the first electrode; an emission layer (EML) between the first electrode and the second electrode; a first electron transport layer (ETL) between the second electrode and the EML, the first ETL including a first electron transporting material; a second ETL between the second electrode and the first ETL, the second ETL including a second electron transporting material; a third ETL between the second electrode and the second ETL, the third ETL including a third electron transporting material and a fourth electron transporting material; and a hole transport layer (HTL) between the first electrode and the EML. The first electron transporting material may have an electron mobility smaller than that of the second electron transporting material at an electric field of 800 to 1000 V/cm. The second electron transporting material and the third electron transporting material may each independently have an electron mobility of about $10^{-8}$ to about $10^{-3}$ cm$^2$/V·s at an electric field of 800 to 1000 V/cm. The third electron transport layer may have an electron injection barrier of about 0.2 eV or less at an interface between the third ETL and the second electrode.

FIG. 1A illustrates a schematic sectional view of an organic light-emitting device according to an embodiment.

Referring to FIG. 1A, the organic light-emitting device according to the present embodiment may include a substrate; a first electrode and a second electrode on the substrate; an EML between the first electrode and the second electrode; a first ETL, a second ETL, and a third ETL between the second electrode and the EML; and a HTL between the first electrode and the EML. The first ETL may include a first electron transporting material, the second ETL may include a second electron transporting material, and the third ETL may include a third electron transporting material and a fourth electron transporting material.

Charge balance of the EML may play a significant role during manufacturing of an organic light-emitting device with improved luminescence efficiency. For example, the first electron transporting material may have an electron mobility smaller than that of the second electron transporting material at an electric field of 800 to 1000 V/cm. The second electron transporting material and the third electron transporting material may each have an electron mobility of about $10^{-8}$ to about $10^{-3}$ cm$^2$/V·s at an electric field of 800 to 1000 V/cm. The fourth electron transporting material may have an electron injection barrier of about 0.2 eV or less at an interface between the third ETL and the second electrode.

In this regard, the electron mobility refers to a ratio of a drift speed of an electron with respect to an electric field applied from the outside, and physically means an electron mobility per unit voltage and unit time (one second). The electron mobility may be evaluated according to a time of flight (TOF) measurement method or a space charge limited current (SCLC) measurement method.

The third ETL may include the third electron transporting material and the fourth electron transporting material. The third electron transporting material may have an electron mobility of about $10^{-8}$ to about $10^{-3}$ cm$^2$/V·s at an electric field of 800 to 1000 V/cm, and thus may have high electron mobility. The fourth electron transporting material may have an electron injection barrier of about 0.2 eV or less at an interface between the third ETL and the second electrode, and thus electrons may be easily injected into the fourth electron transporting material. The third ETL may control an electron mobility rate and may lower a driving voltage of the organic light-emitting device.

The third ETL may include the third electron transporting material and the fourth electron transporting material in a weight ratio of the third electron transporting material to the fourth electron transporting material of about 5:95 to about 95:5. Maintaining the ration of the third electron transporting material to the fourth electron transporting material at about 5:95 to about 95:5 may help ensure that the electron mobility rate is controlled and the driving voltage of the organic light-emitting device is lowered.

The second ETL may include a second electron transporting material having an electron mobility of about $10^{-8}$ to about $10^{-3}$ cm$^2$/V·s at an electric field of 800 to 1000 V/cm. The second ETL may control the electron mobility rate.

The first ETL may include a first electron transporting material having an electron mobility smaller than that of the second electron transporting material. The first ETL may control the electron mobility rate and may have an electron mobility smaller than that of the second ETL. The first ETL may have an interface with respect to the EML and may include a material having an electron mobility smaller than that of the second ETL in order to improve characteristics of the interface and lifetime characteristics of the organic light-emitting device.

Compared to an organic light-emitting layer including a single-layer ETL, an organic light-emitting device having the three-layer ETL, as described above, may have flexible electron injection and electron transport characteristics and may have a low driving voltage and low power consumption. The third ETL may lower an electron injection barrier at the interface between the second electrode and the third ETL and thus may reduce a driving voltage of the organic light-emitting layer. The second ETL may increase the electron mobility rate and thus may further reduce the driving voltage of the organic light-emitting layer. The first ETL may reduce the electron mobility rate and may improve lifetime characteristics of the organic light-emitting device.

As described above, the first electron transporting material may have an electron mobility smaller than that of the second electron transporting material. For example, the electron mobility of the first electron transporting material may be smaller than the electron mobility of the second electron transporting material by about $10^{-5}$ to about $10^4$ cm$^2$/V·s.

The first electron transporting material may include a metal complex including, e.g., an oxadiazole derivative, a triazine derivative, a triazole derivative, and/or an 8-hydroxyquinoline derivative. For example, the first electron transporting material may include at least one of 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7), 4,4'-bis-[2-(4,6-diphenyl-1,3,5-triazinyl)]-1,1'-biphenyl (T1), 3-(4-biphenyl)-4-phenyl-5-(4-tert-butylphenyl)-1,2,4-triazole (TAZ), tris(8-hydroxyquinoline)aluminum (Alq$_3$), and bis(8-hydroxy-2-methylquinoline)-(4-phenylphenoxy)aluminum (Balq).

As described above, the second electron transporting material may have an electron mobility of about $10^{-8}$ to about $10^{-3}$ cm$^2$/V·s at an electric field of 800 to 1000 V/cm, e.g., an electron mobility of about $10^{-8}$ to about $10^{-6}$ cm$^2$/V·s at an electric field of 800 to 1000 V/cm.

The second electron transporting material may include a metal complex including, e.g., a phenanthroline derivative, an anthracene derivative, a pyrimidine derivative, a pyridine derivative, and/or a benzoquinoline derivative. For example, the second electron transporting material may include at least one of 2,9-dimethyl-4,7-diphenylphenanthroline (DPhPhen), (poly[(9,9-di-hexylfluorene-2,7-diyl)-co-(pyridine-3,5-diyl)]) (PF-Py), and bis(10-hydroxybenzo[h]quinolinato)beryllium (Bebq$_2$).

The third electron transporting material may have an electron mobility of about $10^{-8}$ to about $10^{-3}$ cm$^2$/V·s at an electric field of 800 to 1000 V/cm, e.g., an electron mobility of about $10^{-7}$ to about $10^{-4}$ cm$^2$/V·s at an electric field of 800 to 1000 V/cm.

The third electron transporting material may include a metal complex including, e.g., a phenanthroline derivative, an anthracene derivative, a pyrimidine derivative, a pyridine derivative, and a benzoquinoline derivative. For example, the second electron transporting material may include at least one of 2,9-dimethyl-4,7-diphenylphenanthroline (DPhPhen), poly[(9,9-di-hexylfluorene-2,7-diyl)-co-(pyridine-3,5-diyl)] (PF-Py), and bis(10-hydroxybenzo[h]quinolinato)beryllium (Bebq$_2$). The third electron transporting material and the second electron transporting material may be identical to each other, i.e., may be the same material. In an implementation, the third ETL may include, in addition to the third electron transporting material, the fourth electron transporting material such that a material for forming the third ETL is not completely identical to a material for forming the second ETL. Accordingly, the organic light-emitting layer may have a simple manufacturing process while maintaining high charge delivery characteristics.

As described above, the fourth electron transporting material may have an electron injection barrier of about 0.2 eV or less at the interface between the third ETL and the second electrode. The second electrode may include, e.g., lithium (Li), magnesium (Mg), aluminum (Al), calcium (Ca), silver (Ag), ytterbium (Yb), aluminum-lithium (Al—Li), magnesium-indium (Mg—In), magnesium-silver (Mg—Ag), and/or silver-ytterbium (Ag—Yb). The fourth electron transporting material may include, e.g., LiF, LiQ, NaQ, CsF, BaF, BaO, Al$_2$O$_3$, Ca, Cs, Yb, and/or C$_{60}$.

Electrons may move more slowly in the first ETL than in the second ETL. Thus, in an electron-only-device including the first ETL and the second ETL, a driving voltage of the first ETL may be smaller than a driving voltage of the second ETL.

The first ETL may have a thickness of about 5 to about 30 nm; and the second ETL may have a thickness of about 3 to about 20 nm. Maintaining the thickness of first ETL at about 5 to about 30 nm and the second ETL at about 3 to about 20 nm may help ensure that interface resistance characteristics do not deteriorate when the organic light-emitting layer is driven and that electrons move smoothly. The third ETL may have a thickness of about 3 to about 20 nm. Maintaining the thickness of the third ETL at about 3 to about 20 nm may help ensure that a driving voltage of the organic light-emitting layer is reduced.

For example, a sum of the thicknesses of the first ETL, the second ETL, and the third ETL may be about 11 to about 70 nm.

The HTL may be between the first electrode and the EML. The HTL may include, e.g., N-phenylcarbazole, polyvinylcarbazole, 1,3,5-tricarbazolylbenzene, 4,4'-bis(carbazolyl)biphenyl, m-bis(carbazolyl)phenyl, 4,4'-bis(carbazolyl)-2,2'-dimethylbiphenyl, 4,4',4"-tris(N-carbazolyl)triphenylamine, 1,3,5-tris(2-carbazolylphenyl)benzene, 1,3,5-tris(2-carbazolyl-5-methoxyphenyl)benzene, bis(4-carbazolylphenyl)silane, N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'-diamine (TPD), poly(9,9-dioctylfluorene-co-N-(4-butylphenyl)diphenylamine (TFB), and/or poly(9,9-dioctylfluorene-co-bis(4-butylphenyl-bis-N,N-phenyl-1,4-phenylenediamin (PFB).

Figure 1B:
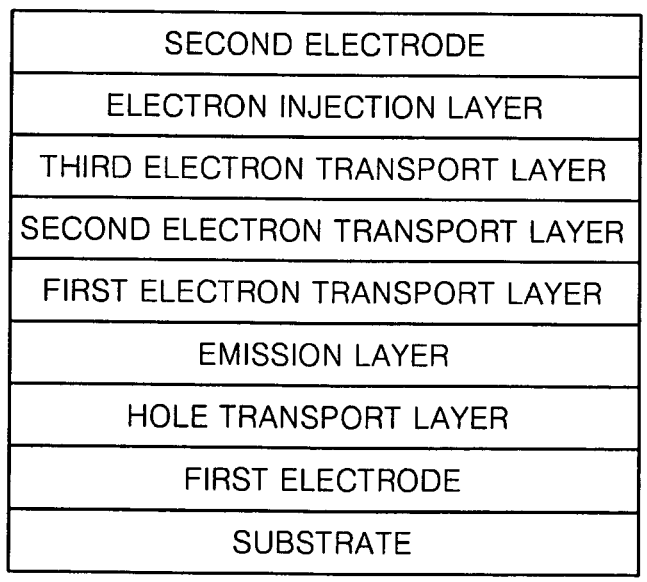

FIG. 1B illustrates a schematic sectional view of an organic light-emitting device according to another embodiment. According to the present embodiment, the organic light-emitting device may further include an electron injection layer (EIL) between the second electrode and the third ETL. The electron injection layer may include, e.g., LiF, LiQ, NaCl, NaQ, BaF, CsF, Li$_2$O, Al$_2$O$_3$, BaO, and/or C$_{60}$, but is not limited thereto.

Figure 1C:
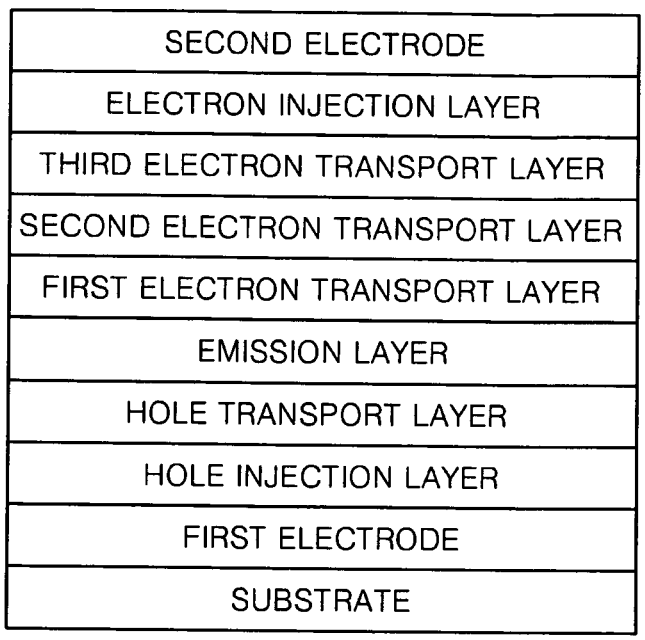

FIG. 1C illustrates a schematic sectional view of an organic light-emitting device according to yet another embodiment.

According to the present embodiment, the organic light-emitting device may further include a hole injection layer (HIL) between the first electrode and the HTL. Referring to FIG. 1C, the organic light-emitting device may include a substrate; a first electrode and a second electrode on the substrate; an EML between the first electrode and the second electrode; a first ETL, a second ETL, and a third ETL between the second electrode and the EML; a HTL between the first electrode and the EML; an EIL between the second electrode and the third ETL; and a HIL between the first electrode and the HTL.

Figure 1D:
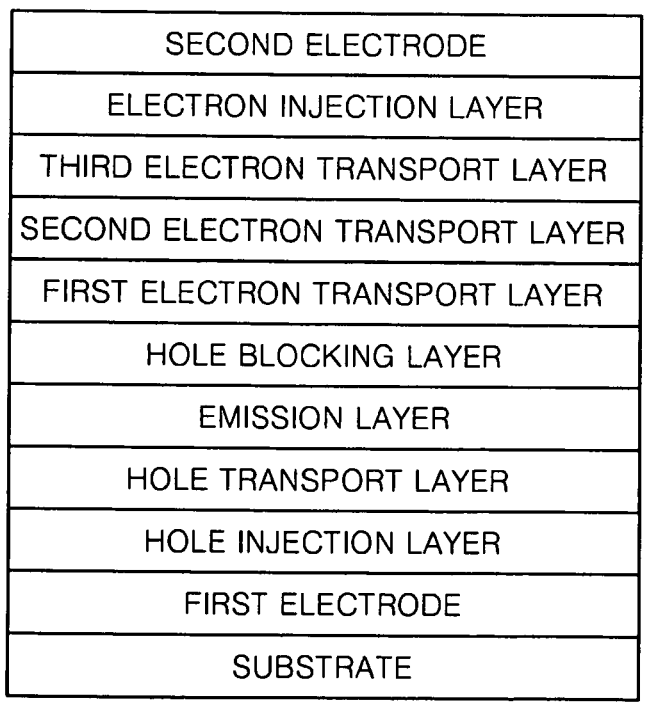

FIG. 1D illustrates a schematic sectional view of an organic light-emitting device according to still another embodiment. According to the present embodiment, the organic light-emitting device may further include a hole blocking layer (HBL) between the EML and the first ETL. Alternatively, although not illustrated in FIG. 1D, the HBL may instead be between the EML and the HTL. Referring to FIG. 1D, the organic light-emitting device may include a substrate; a first electrode and a second electrode on the substrate; an EML between the first electrode and the second electrode; a first ETL, a second ETL, and a third ETL between the second electrode and the EML; a HTL between the first electrode and the EML; an EIL between the second electrode and the third ETL; a HIL between the first electrode and the HTL; and a HBL between the EML and the first ETL.

In an implementation, the organic light-emitting device may further include an electron blocking layer between the emission layer EML and the hole transporting layer HTL.

Hereinafter, a method of manufacturing an organic light-emitting device will be described in detail by referring to the structures of the organic light-emitting devices illustrated in FIGS. 1A to 1D.

First, a first electrode material having a high work function may be deposited or sputtered on the substrate to form the first electrode. The first electrode may constitute an anode. The substrate may be a substrate typically used in organic light-emitting devices, and may include, e.g., a glass substrate or a transparent plastic substrate, with excellent mechanical strength, thermal stability, transparency, surface smoothness, ease of handling, and water repellency. The first electrode material may be transparent and highly conductive and may include, e.g., indium tin oxide (ITO), indium zinc oxide (IZO), tin oxide ($SnO_2$), and/or zinc oxide (ZnO).

Next, the HIL may be formed on the first electrode using various methods, e.g., by vacuum deposition, spin coating, casting, Langmuir-Blodgett (LB) deposition, or the like. In an implementation, the HIL may not be included. When the HIL is formed by vacuum deposition, the deposition conditions may vary according to a material that is used to form the HIL as well as a structure and thermal characteristics of the HIL. For example, the deposition conditions may include a deposition temperature of about 50 to about 500° C., a vacuum pressure of about $10^{-8}$ to about $10^{-3}$ torr, a deposition rate of about 0.01 to about 100 Å/sec, and a layer thickness of about 10 Å to about 5 μm.

The HIL may include a typical hole injection material, e.g., 4,4',4"-tris(3-methylphenylamino)triphenylamino (m-MTDATA), 3,5-tris[4-(3-methylphenylamino)phenyl]benzene (m-MTDATB), phthalocyanine copper (CuPc), 4,4', 4"-tris(N-carbazolyl)triphenylamine (TCTA), and/or N,N'-di (4-(N,N'-diphenyl-amino)phenyl)-N,N'-diphenylbenzidine (DNTPD), but is not limited thereto.

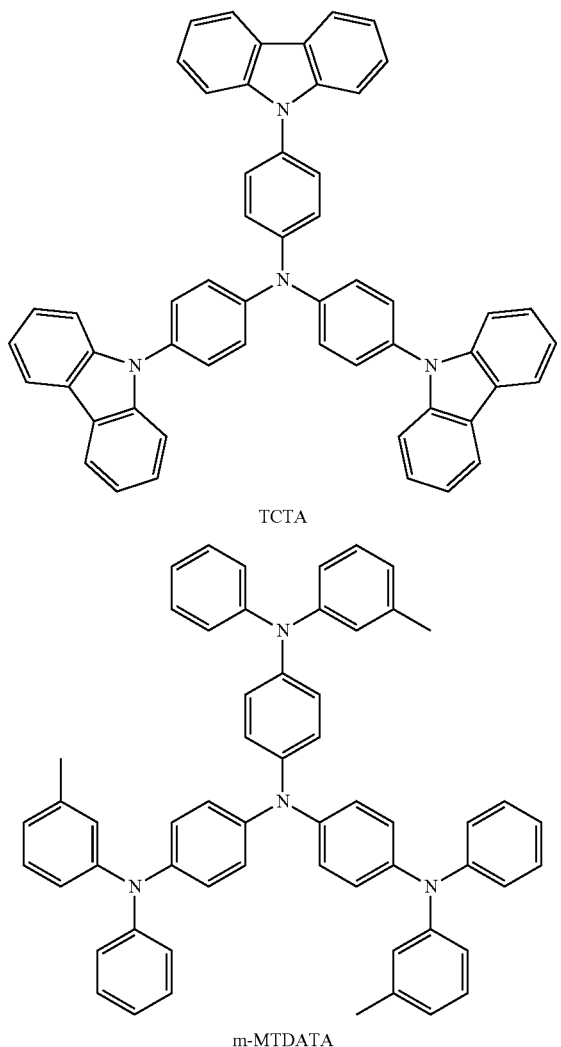

TCTA m-MTDATA

The HTL may be formed on the HIL or the first electrode using various methods, e.g., vacuum deposition, spin coating, casting, LB deposition, or the like. When the HTL is formed using vacuum deposition or spin coating, the deposition or coating conditions may be similar to those applied to form the HIL, though the deposition or coating conditions may vary according to the material that is used to form the HTL.

The HTL may include a hole transporting material, e.g., N-phenylcarbazole, polyvinylcarbazole, 1,3,5-tris(carbazolyl)benzene, 4,4'-bis(carbazolyl)biphenyl, m-bis(carbazolyl)phenyl, 4,4'-bis(carbazolyl)-2,2'-dimethylbiphenyl, 4,4',4"-tris(N-carbazolyl)triphenylamine, 1,3,5-tris(2-carbazolylphenyl)benzene, 1,3,5-tris(2-carbazolyl-5-methoxyphenyl)benzene, bis(4-carbazolylphenyl)silane, N,N'-diphenyl-N,N"-bis(1-naphthyl)-(1,1'-biphenyl)-4,4"-diamine (NPB), N,N'-bis(3-methylphenyl)-N,N"-diphenyl-[1,1-biphenyl]-4,4"-diamine (TPD), poly(9,9-dioctylfluorene-co-N-(4-butylphenyl)diphenylamine (TFB), and/or poly(9,9-dioctylfluorene-co-bis-(4-butylphenyl-bis-N,N-phenyl-1,4-phenylenediamin (PFB).

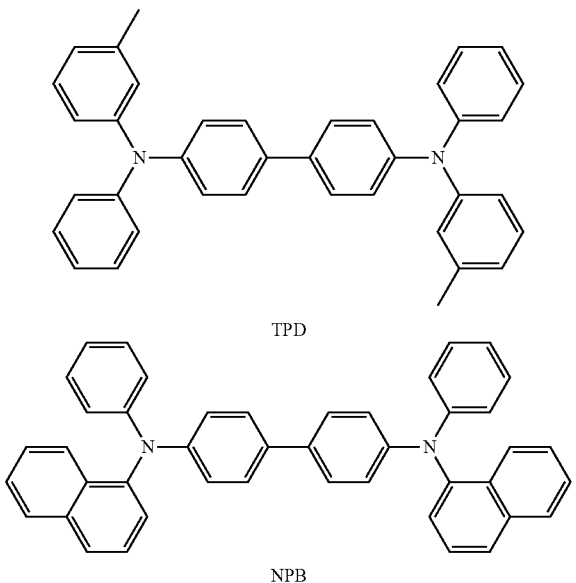

TPD

NPB

Next, the EML may be formed on the HTL. A material for forming the EML may not be limited. In this regard, the EML may be formed using various methods, e.g., by vacuum deposition, spin coating, casting, LB deposition, or the like.

The EML may have a thickness of about 10 nm to about 500 nm. Maintaining the thickness of the EML at about 10 nm or greater may help ensure that a leakage current does not occur and that efficiency and lifetime of the organic light-emitting layer is increased. Maintaining the thickness of the EML at about 500 nm or less may help ensure that the driving voltage of the organic light-emitting layer is not increased.

The EML forming material is not limited, and may include a host, e.g., Alq$_3$, 4,4'-N,N'-dicarbazole-biphenyl (CBP), poly(n-vinylcarbazole) (PVK), and/or distyrylarylene (DSA), and a dopant, e.g., PtOEP, Ir(piq)$_3$, Btp$_2$Ir(acac), and DCJTB which are red dopants; Ir(ppy)$_3$ (ppy=phenylpyridine), Ir(ppy)$_2$(acac), Ir(mpyp)$_3$ which are green dopants; and/or F$_2$Irpic, (F$_2$ ppy)$_2$Ir(tmd), Ir(dfppz)$_3$, and ter-fluorene which are blue dopants.

The EML may be formed by adding an emission-type dopant to an emission-type host. A fluorescent emission-type host may include, e.g., tris(8-hydroxy-quinolinato)aluminum (Alq3), 9,10-di(naphthi-2-yl)anthracene (ADN), 3-tert-butyl-9,10-di(naphthi-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene) (TDAF), 2-(9,9'-spirobifluorene-2-yl)-9,9'-spirobifluorene (BSDF), 2,7-bis (9,9'-spirobifluorene-2-yl)-9,9'-spirobifluorene (TSDF), bis (9,9-diarylfluorene) (BDAF), and/or 4,4'-bis(2,2-diphenyl-ethene-1-yl)-4,4'-di-(tert-butyl)phenyl (p-TDPVBi). A phosphorescent emission-type host may include, e.g., 1,3-bis (carbazole-9-yl)benzene (mCP), 1,3,5-tris(carbazole-9-yl) benzene (tCP), 4,4',4"-tris(carbazole-9-yl)triphenylamine (TcTa), 4,4'-bis(carbazole-9-yl)biphenyl (CBP), 4,4'-bis(9-carbazoleyl)-2,2'-dimethyl-biphenyl (CDBP), 4,4'-bis(carbazole-9-yl)-9,9-dimethyl-fluorene (DMFL-CBP), 4,4'-bis (carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), and/or 9,9-bis(9-phenyl-9H-carbazole)fluorene (FL-2CBP). However, the fluorescent emission-type host and the phosphorescent emission-type host are not limited thereto.

The dopant may be included in an amount of about 0.1 to about 20 parts by weight, based on 100 parts by weight of the EML material, which is equivalent to a total weight of the host and the dopant. Maintaining the amount of the dopant at about 0.1 parts by weight or more may help ensure that an effect caused by addition of the dopant is obtained. Maintaining the amount of the dopant at about 20 parts by weight or lower may help ensure that concentration quenching does not occur in phosphorescence and fluorescence cases.

The first ETL, the second ETL, and the third ETL may be sequentially deposited on the EML. The first, second, and third ETLs may be formed using various methods, e.g., thermal decomposition, vacuum deposition, chemical vapor deposition (CVD), sputtering, spin coating, or spin casting. When the first, second, and third ETLs are formed by vacuum deposition or spin coating, the deposition and coating conditions may be similar to those used to form the HIL, though the deposition or coating conditions may vary according to the materials that are used to form the first, second, and third ETLs.

A sum thickness of the first, second, and third ETLs may be about 11 to about 70 nm. For example, the thickness of the first ETL may be about 5 to about 30 nm, the thickness of the second ETL may be about 3 to about 20 nm, and the thickness of the third ETL may be about 3 to about 20 nm.

The first ETL may include the first electron transporting material. Examples of the first electron transporting material have already been described above.

The second ETL may include the second electron transporting material having an electron mobility greater than that of the first electron transporting material. The electron mobility of the second electron transporting material may be about $10^{-8}$ to about $10^{-3}$ cm$^2$/V·s at an electric field of 800 to 1000 V/cm. Examples of the second electron transporting material have already been described above.

The third ETL may include the third electron transporting material having an electron mobility of about $10^{-8}$ to about $10^{-3}$ cm$^2$/V·s at an electric field of 800 to 1000 V/cm. The third ETL may further include the fourth electron transporting material having an electron injection barrier of about 0.2 eV or less at the interface between the third ETL and the second electrode. Examples of the third and fourth electron transporting materials have already been described above.

Then, the EIL, which may facilitate electron injections from the second electrode to the ETL, may be deposited on the ETL. In an implementation, the EIL may not be included. A material for forming the EIL is not limited and may include, e.g., LiF, LiQ, NaCl, NaQ, BaF, CsF, Li$_2$O, Al$_2$O$_3$, BaO, C$_{60}$, and/or a mixture thereof. A thickness of the EIL may be about 1 Å to about 100 Å. Maintaining the thickness of the EIL at about 1 Å to about 100 Å may help ensure that excellent electron injection characteristics are obtained without a substantial increase in a driving voltage.

Finally, the second electrode may be formed on the EIL by, e.g., vacuum deposition, sputtering, or the like. The second electrode may constitute a cathode. A material for forming the second electrode may include, e.g., a metal, an alloy, or an electrically conductive compound, which are materials having a low work function, or a mixture thereof. Examples of such materials may include, but are not limited to, lithium (Li), magnesium (Mg), aluminum (Al), calcium (Ca), silver (Ag), ytterbium (Yb), aluminum-lithium (Al—Li), magnesium-indium (Mg—In), magnesium-silver (Mg—Ag), and silver-ytterbium (Ag—Yb). A transparent cathode formed of a transparent material, e.g., ITO or IZO, may be used as the second electrode.

If the EML includes a phosphorescent dopant, a HBL may be formed on the EML to prevent diffusion of a triplet exciton or a hole into the first ETL. In this regard, the manufactured organic light-emitting device may have a structure constituted of substrate/first electrode/HIL/HTL/EML/HBL/first ETL/second ETL/third ETL/EIL/second electrode.

A material for forming the HBL is not limited, and may include any suitable HBL forming material. Examples of such a material may include an oxdadiazole derivative, a triazol derivative, a phenanthroline derivative, Balq, and/or BCP.

Hereinafter, the embodiments will be described in detail with reference to examples. However, these examples are for illustrative purposes only and are not intended to limit the scope of the embodiments.

Example 1

To manufacture an anode, a Corning 15 $\Omega/cm^2$ (1200 Å) ITO glass substrate was cut to a size of 50 mm×50 mm×0.7 mm, sonicated for five minutes in isopropyl alcohol and for five minutes in pure water, and then cleaned by irradiation of ultraviolet rays for 30 minutes and exposure to ozone.

Then, DNTPD was deposited on the substrate to form a HIL having a thickness of 60 nm. Then, NPB was vacuum deposited on the HIL to form a HTL having a thickness of 30 nm. Subsequently, 95 parts by weight of DSA as a host and 5 parts by weight of distyrylanthracene-amine (DSA-amine) as a dopant were vacuum deposited on the HTL to form an EML having a thickness of 30 nm.

Then, $Alq_3$ was vacuum deposited on the EML to form a first ETL having a thickness of 20 nm, $Bebq_2$ was vacuum deposited on the first ETL to form a second ETL having a thickness of 5 nm, and $Bebq_2$ and LiF were vacuum co-deposited in a weight ratio of 1:1 on the second ETL to form a third ETL having a thickness of 5 nm.

LiF was vacuum deposited on the third ETL to form an EIL having a thickness of 1 nm. Then, Al (cathode) was vacuum deposited on the EIL to form an Al electrode having a thickness of 200 nm, thereby completing manufacturing of an organic light-emitting device.

Example 2

An organic light-emitting layer was manufactured in the same manner as in Example 1, except that 90 parts by weight of CBP as a host and 10 parts by weight of $Ir(ppy)_3$ as a dopant were vacuum deposited to form an EML, Alq3 was vacuum deposited on the EML to form a first ETL having a thickness of 10 nm, $Bebq_2$ was vacuum deposited on the first ETL to form a second ETL having a thickness of 10 nm, and $Bebq_2$ and LiF in a mixed weight ratio of 1:1 was vacuum co-deposited to form a third ETL having a thickness of 10 nm.

Comparative Examples 1

To manufacture an anode, a Corning 15 $\Omega/cm^2$ (1200 Å) ITO glass substrate was cut to a size of 50 mm×50 mm×0.7 mm, sonicated for five minutes in isopropyl alcohol and for five minutes in pure water, and then cleaned by irradiation of ultraviolet rays for 30 minutes and exposure to ozone.

NPB was vacuum deposited on the substrate to form a HTL having a thickness of 30 nm. Subsequently, 95 parts by weight of DSA as a host and 5 parts by weight of distyrylanthracene-amine (DSA-amine) as a dopant were vacuum deposited on the HTL to form an EML having a thickness of 30 nm.

Then, $Bebq_2$ was vacuum deposited on the EML to form an ETL having a thickness of 30 nm.

LiF was vacuum deposited on the ETL to form an EIL having a thickness of 1 nm, and then Al (cathode) was vacuum deposited on the EIL to form an Al electrode having a thickness of 200 nm, thereby completing manufacturing of an organic light-emitting device.

Comparative Examples 2

An organic light-emitting device was manufactured in the same manner as in Comparative Example 1, except that $Alq_3$, instead of $Bebq_2$, was vacuum deposited on the substrate to form an ETL having a thickness of 30 nm.

Comparative Examples 3

An organic light-emitting device was manufactured in the same manner as in Comparative Example 1, except that $Bebq_2$ and LiF in a mixed weight ratio of 1:1, instead of $Bebq_2$ alone, were co-vacuum deposited to form an ETL having a thickness of 30 nm.

Comparative Examples 4

An organic light-emitting device was manufactured in the same manner as in Example 2, except that only $Bebq_2$ was vacuum deposited on the EML to form an ETL having a thickness of 30 nm.

Analysis

Figure 2:
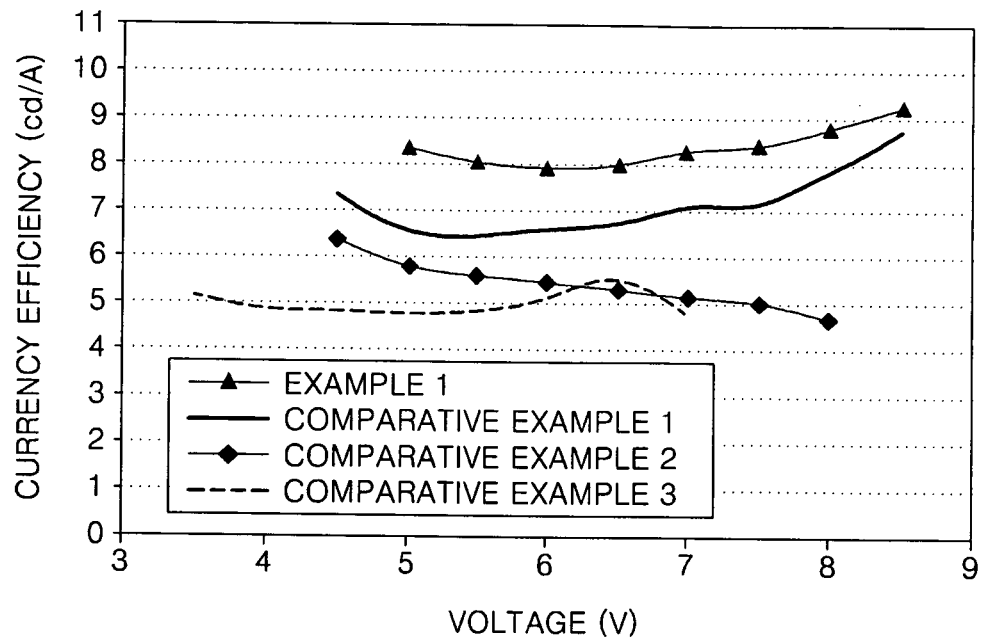
FIG. 2 illustrates a graph of current efficiency versus voltage of organic light-emitting devices prepared according to Example 1 and Comparative Examples 1 through 3.
Figure 3:
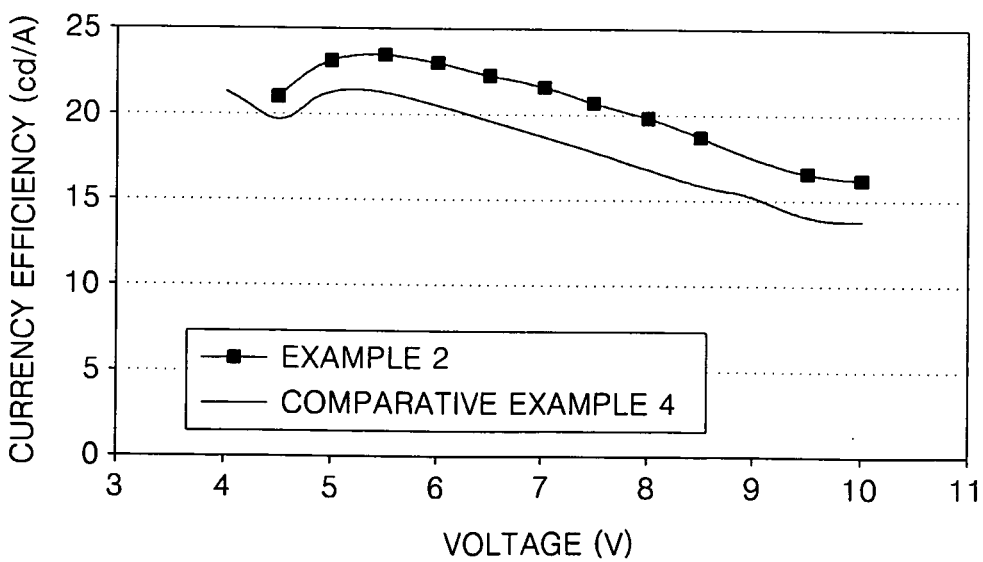
FIG. 3 illustrates a graph of current efficiency versus voltage of organic light-emitting devices prepared according to Example 2 and Comparative Example 4.

Luminescence efficiencies with respect to brightness of the organic light-emitting layers manufactured according to Examples 1 and 2 and Comparative Examples 1 through 4 were evaluated; and the results are shown in FIGS. 2 and 3.

Referring to FIG. 2, the luminescence efficiency of Example 1 was higher than the luminescence efficiencies of Comparative Examples 1 through 3.

Referring to FIG. 3, the luminescence efficiency of Example 2 was higher than the luminescence efficiency of Comparative Examples 4.

By way of review, the hole related layer and the electron related layer may control injection or mobility of holes and electrons provided from the cathode and the anode to improve luminescence efficiency of organic light-emitting devices. Typically, organic light-emitting devices have lower luminescence efficiency than other information display devices, e.g., thin film transistor-liquid crystal devices (TFT-LCDs). Accordingly, the embodiments provide an improved structure of the electron related layer to, in turn, provide an organic light-emitting device with improved luminescence efficiency.

The organic light-emitting devices according to the embodiments exhibit improved luminescence efficiencies due to, e.g., a charge balance.

The embodiments provide an organic light-emitting device with improved luminescence efficiency due to a charge balance obtained from a novel structure of an electron related layer, e.g., inclusion of a plurality of electron transport layers.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:
a substrate;
a first electrode;
a second electrode facing the first electrode;
an emission layer between the first electrode and the second electrode;
a first electron transport layer between the second electrode and the emission layer, the first electron transport layer including a first electron transporting material;
a second electron transport layer between the second electrode and the first electron transport layer, the second electron transport layer including a second electron transporting material;
a third electron transport layer between the second electrode and the second electron transport layer, the third electron transport layer including a third electron transporting material and a fourth electron transporting material; and
a hole transport layer between the first electrode and the emission layer,
wherein:
the first electron transporting material has an electron mobility smaller than an electron mobility of the second electron transporting material at an electric field of 800 to 1000 V/cm,
the second electron transporting material and the third electron transporting material each independently have an electron mobility of about $10^{-8}$ to about $10^{-3}$ cm$^2$/V·s at an electric field of 800 to 1000 V/cm, and
the third electron transport layer has an electron injection barrier of about 0.2 eV or less at an interface between the third electron transport layer and the second electrode.

2. The organic light-emitting device as claimed in claim 1, wherein the first electron transporting material includes a metal complex including at least one of an oxadiazole derivative, a triazine derivative, a triazole derivative, and an 8-hydroxyquinoline derivative.

3. The organic light-emitting device as claimed in claim 1, wherein the first electron transporting material includes at least one of 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7), 4,4'-bis-[2-(4,6-diphenyl-1,3,5-triazinyl)]-1,1'-biphenyl (T1), 3-(4-biphenyl)-4-phenyl-5-(4-tert-butylphenyl)-1,2,4-triazole (TAZ), tris(8-hydroxyquinoline)aluminum (Alq$_3$), and bis(8-hydroxy-2-methylquinoline)-(4-phenylphenoxy)aluminum (Balq).

4. The organic light-emitting device as claimed in claim 1, wherein the second electron transporting material includes a metal complex including at least one of a phenanthroline derivative, an anthracene derivative, a pyrimidine derivative, a pyridine derivative, and a benzoquinoline derivative.

5. The organic light-emitting device as claimed in claim 1, wherein the second electron transporting material includes at least one of 2,9-dimethyl-4,7-diphenylphenanthroline (DPhPhen), (poly[(9,9-di-hexylfluorene-2,7-diyl)-co-(pyridine-3,5-diyl)]) (PF-Py), and bis(10-hydroxybenzo[h]quinolinato)beryllium (Bebq$_2$).

6. The organic light-emitting device as claimed in claim 1, wherein the third electron transporting material includes at least one of phenanthroline derivative, an anthracene derivative, a pyrimidine derivative, a pyridine derivative, and a benzoquinoline derivative.

7. The organic light-emitting device as claimed in claim 1, wherein the third electron transporting material includes at least one of 2,9-dimethyl-4,7-diphenylphenanthroline (DPhPhen), poly[(9,9-di-hexylfluorene-2,7-diyl)-co-(pyridine-3,5-diyl)] (PF-Py), and bis(10-hydroxybenzo[h]quinolinato)beryllium (Bebq$_2$).

8. The organic light-emitting device as claimed in claim 1, wherein the fourth electron transporting material includes at least one of LiF, LiQ, NaQ, CsF, BaF, BaO, Al$_2$O$_3$, Ca, Cs, Yb, and C$_{60}$.

9. The organic light-emitting device as claimed in claim 1, wherein a difference between an electron mobility of the first electron transporting material and an electron mobility of the second electron transporting material is about $10^{-5}$ to about $10^{-4}$ cm$^2$/V·s at an electric field of 800 to 1000 V/cm.

10. The organic light-emitting device as claimed in claim 1, wherein the second electron transporting material is identical to the third electron transporting material.

11. The organic light-emitting device as claimed in claim 1, wherein a weight ratio of the third electron transporting material to the fourth electron transporting material in the third electron transport layer is about 5:95 to about 95:5.

12. The organic light-emitting device as claimed in claim 1, wherein, in an electron-only-device including the first electron transport layer and the second electron transport layer, a driving voltage of the first electron transport layer is smaller than a driving voltage of the second electron transport layer.

13. The organic light-emitting device as claimed in claim 1, wherein a thickness of the first electron transport layer is about 5 to about 30 nm.

14. The organic light-emitting device as claimed in claim 1, wherein a thickness of the second electron transport layer is about 3 to about 20 nm.

15. The organic light-emitting device as claimed in claim 1, wherein a thickness of the third electron transport layer is about 3 to about 20 nm.

16. The organic light-emitting device as claimed in claim 1, wherein a sum of thicknesses of the first electron transport layer, the second electron transport layer, and the third electron transport layer is about 11 to about 70 nm.

17. The organic light-emitting device as claimed in claim 1, wherein the hole transport layer includes at least one of N-phenylcarbazole, polyvinylcarbazole, 1,3,5-tris(carbazolyl)benzene, 4,4'-bis(carbazolyl)biphenyl, m-bis(carbazolyl)phenyl, 4,4'-bis(carbazolyl)-2,2'-dimethylbiphenyl, 4,4',4"-tris(N-carbazolyl)triphenylamine, 1,3,5-tris(2-carbazolylphenyl)benzene, 1,3,5-tris(2-carbazolyl-5-methoxyphenyl)benzene, bis(4-carbazolylphenyl)silane, N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4"-diamine (TPD), poly(9,9-dioctylfluorene-co-N-(4-butylphenyl)diphenylamine (TFB), and poly(9,9-dioctylfluorene-co-bis-(4-butylphenyl-bis-N,N-phenyl-1,4-phenylenediamin (PFB).

18. The organic light-emitting device as claimed in claim 1, further comprising an electron injection layer between the second electrode and the third electron transport layer.

19. The organic light-emitting device as claimed in claim 18, wherein the electron injection layer includes at least one of LiF, LiQ, NaCl, NaQ, BaF, CsF, Li$_2$O, Al$_2$O$_3$, BaO, and C$_{60}$.

20. The organic light-emitting device as claimed in claim 1, further comprising a hole injection layer between the first electrode and the hole transport layer.

21. The organic light-emitting device as claimed in claim 1, wherein the second electrode includes at least one of lithium (Li), magnesium (Mg), aluminum (Al), calcium (Ca), silver (Ag), ytterbium (Yb), aluminum-lithium (Al—Li), magnesium-indium (Mg—In), magnesium-silver (Mg—Ag), and silver-ytterbium (Ag—Yb).

22. The organic light-emitting device as claimed in claim 1, further comprising a hole blocking layer between the emission layer and the first electron transporting layer.

23. The organic light-emitting device as claimed in claim 1, wherein the organic light-emitting layer includes a structure of a sequentially stacked: substrate/first electrode/hole injection layer/hole transport layer/emission layer/$Alq_3$-containing first electron transport layer/$Bebq_2$-containing second electron transport layer/$Bebq_2$ and LiF-containing third electron transport layer/electron injection layer/second electrode.

\* \* \* \* \*